United States Patent [19]

Loce et al.

[11] Patent Number: 4,692,015

[45] Date of Patent: Sep. 8, 1987

[54] SHORT FOCAL LENS ARRAY WITH MULTI-MAGNIFICATION PROPERTIES

[75] Inventors: Robert P. Loce, Webster; James D. Rees, Pittsford; John A. Durbin, Webster, all of N.Y.

[73] Assignee: Xerox Corporation, Stamford, Conn.

[21] Appl. No.: 839,667

[22] Filed: Mar. 14, 1986

[51] Int. Cl.[4] .............................................. G03B 27/00
[52] U.S. Cl. .......................................... 355/1; 355/46
[58] Field of Search ...................................... 355/46, 1

[56] References Cited

U.S. PATENT DOCUMENTS

| 4,168,900 | 9/1979 | Adachi ................................ 355/1 |
| 4,331,380 | 5/1982 | Rees et al. ........................ 355/1 X |
| 4,462,662 | 7/1984 | Lama ................................ 355/1 X |

OTHER PUBLICATIONS

Applied Optics, vol. 23, #11, Jun. 1, 1984, p. 1718.

Primary Examiner—Richard A. Wintercorn

[57] ABSTRACT

A short focal length lens array has a plurality of lenslets formed within the body of a photosensitive glass. The lenslets have areas which are oriented such that they tilt away from each other from the center out to the array edges. The lens array acts as a reduction or enlargement lens when reproducing objects at an object plane onto an image plane. A one or two row embodiment is disclosed suitable for incremental scanning of a document at image planes. A further full frame lens array is disclosed for providing full frame exposure of a document at various selected magnifications.

10 Claims, 12 Drawing Figures

SHORT FOCAL LENS ARRAY WITH MULTI-MAGNIFICATION PROPERTIES

The present invention relates to a short focal length lens array and, more particularly, to a short focal lens array having the capability of projecting images of an object at an object plane to an image plane at magnifications other than unity.

The increasing use of compact, desk-type electrophotographic reproduction devices has, at least partially, been enabled by the use of optical imaging systems having relatively short conjugate lengths, e.g. under 100 mm. One example is the use of a lens strip as the image projection device. In this system, described in U.S. Pat. Nos. 3,584,950 and 3,584,952, three lens strip elements, each element containing a plurality of refracting lenslets are coaxially aligned to form a three-lens imaging device having a very short focal length. With this lens design, perfect alignment of the strip element to achieve a 1:1 erect imaging on a photosensitive surface has proven difficult to achieve. The design also requires additional optical baffles between lenses to eliminate cross-talk.

A second example of a short focal length imaging device is disclosed in U.S. Pat. No. 3,658,407. A plurality of gradient index optical fibers are bundled together to form a linear projection lens. This lens array, known as a SELFOC lens (mark registered in Japan and owned by Nippon Sheet Glass Co., Ltd.) has found use in a number of compact commercial document reproduction devices. The manufacture of these lenses is a complex process requiring maintenance of close tolerances on the gradient distribution of each fiber.

A third example of a short focal length imaging system is disclosed in U.S. Pat. No. 4,488,864 and in EPO Publication No. 0133788, both of whose contents are hereby incorporated by reference. The lens array of this system comprises a specially manufactured soft glass which is exposed, on opposite surfaces, to collimated ultraviolet light through a mask. Following a subsequent heat treatment, small spherical lenses are formed at the raised surfaces of the glass body, creating a lens array that functions as an image focusing device.

Heretofore, it has been possible to obtain only 1:1 reproduction of objects utilizing the lens strip and thick lens devices. A gradient index (SELFOC) lens array having magnification capabilities is disclosed in U.S. Pat. No. 4,331,380. According to one embodiment of the present invention, there is provided a description of a thick lens array which has been modified to enable the lens to project either reduced or enlarged images of an object. More particularly, in a first aspect, the present invention is directed to a short focal length lens array comprising a photosensitive glass body having formed therethrough a plurality of lenslets, at least one face of each lenslet having a spherical surface extending above the glass body surface, the lens array characterized by the center axes of said lenslets being tilted with respect to each other from the center of the array out to the array edges. In other embodiments, two dimensional, full frame multi-magnification thick lens arrays are disclosed.

DESCRIPTION

Figure 1B:
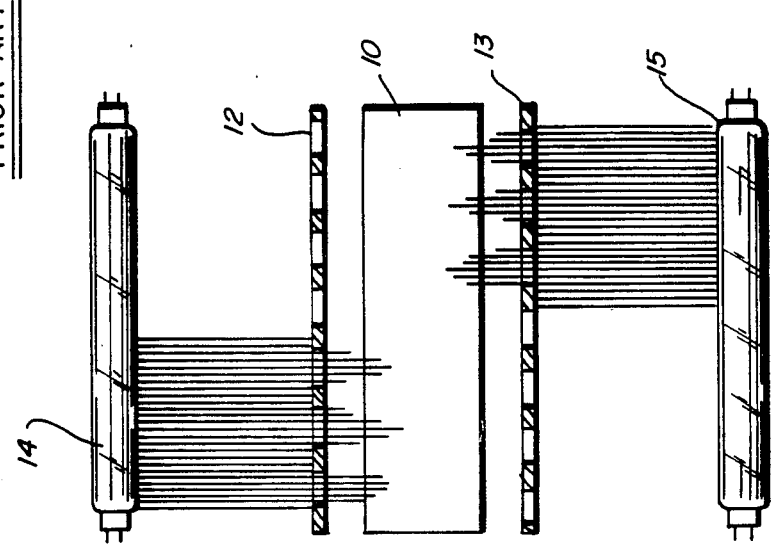
FIGS. 1a and 1b show a top perspective view and a side view, respectively, of a homogeneous soft glass body exposed to a collimated light source through a mask and subsequently developed.
Figure 1A:
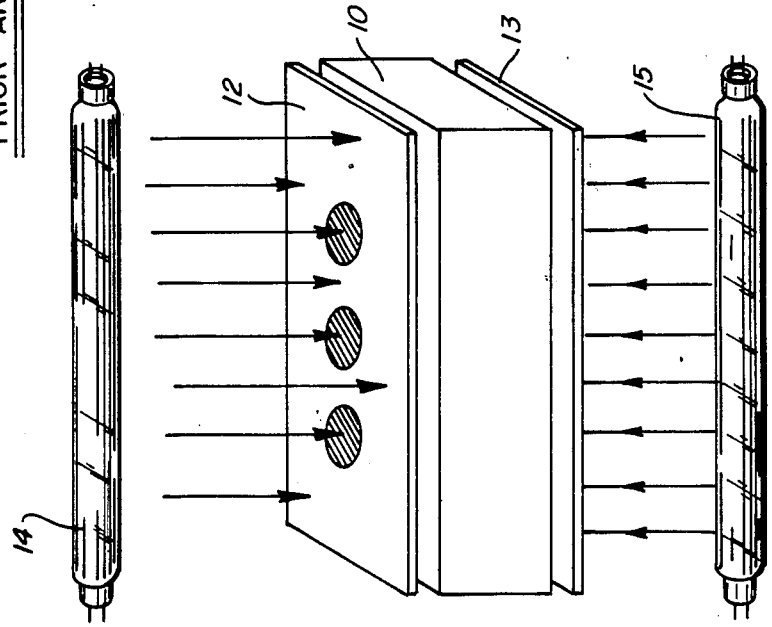
Figure 2A:
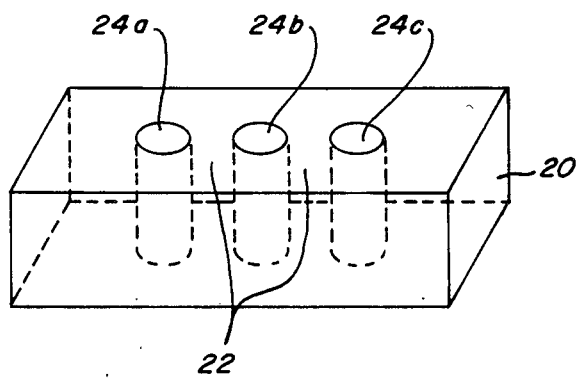
FIGS. 2a and 2b show a top perspective view and a side view, respectively, of a unity magnification thick lens array formed after the exposure and development process.

Referring now to FIG. 1, there is shown a technique for forming a one-row, unity magnification spherical thick lens array of the type disclosed in U.S. Pat. No. 4,488,864. FIG. 2 shows the resultant lens. Referring to FIGS. 1a, 1b a homogeneous glass body 10 has its top and bottom surfaces exposed through photo masks 12, 13 by collimated light from elongated lamps 14, 15. In an exemplary embodiment, glass body 10 is a noble metal photosensitive type having a general composition listed in the Table I below. Masks 12, 13 comprise a chrome pattern on a silica substrate with opaque disks on a transparent background and disposed in a hexagonal close-packed arrangement. Lamps 14, 15 are mercury xenon lamps. The glass is exposed through the mask for an exposure time of between 120 and 600 seconds. The ultraviolet light component of the lamp radiation causes stresses in the glass. These stresses are relieved by heat in a subsequent thermal cycle.

TABLE 1

| Glass Composition Range Wt. % | |
| --- | --- |
| SiO | 75–85 |
| $Li_2O$ | 7–11 |
| $Na_2O$ | 1–2 |
| $K_2O$ | 3–6 |
| $Al_2O_3$ | 3–6 |
| ZnO | 0–2 |
| $Ce_2O_3$ | 0.015 |
| $Sb_2O_3$ | 0.30 |
| Ag | 0.10 |

Figure 2B:
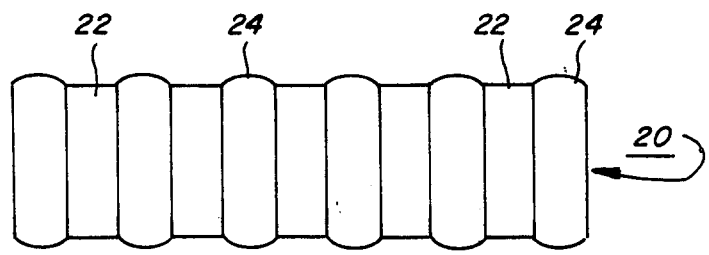

During the thermal cycle, the exposed region on the surface of glass body 10 densifies, developing stresses at the top and bottom surfaces. These stresses squeeze the unexposed cylindrical region of the glass, (underlying the opaque disks of the mask) pushing these regions up above the surface. Surface tension then causes the raised regions to assume a spherical configuration. FIG. 2b thus shows the glass body 10, after this process, now transformed into a lens array 20 comprising a plurality of exposed segments 22 and unexposed segments (cylindrical lenslets 24).

The lens array 20, as is known in the prior art, can be formed so that when placed intermediate an object and image plane, a unity magnification, erect image of an object at the object plane is projected by the lens array onto the image plane. The following formula governs this relationship:

$$t = \frac{TR_c}{(n-1)T - 2nR_c} \quad (1)$$

where t is the 1—1 erect conjugate image working distance, T the lens thickness, $R_c$ the radius of curvature of the lens and n the refractive index of the glass.

Figure 3:
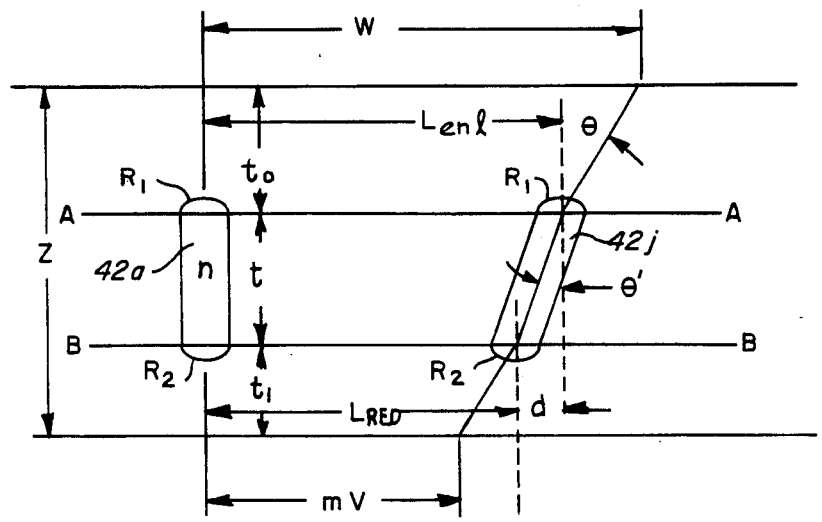
FIG. 3 shows the geometrical relationships between a central lenslet and an off-center lenslet.

According to one aspect of the present invention it has been found that if the lenslets 24 are formed such that their center axes are tilted with respect to each other from the center of the array outward to both ends, a reduced or enlarged image is projected by the array (depending on which surface is oriented toward the object plane) onto an image plane. FIG. 3 shows a portion of a reduction enlargement lens array having a centrally located lenslet 42a and a second lenslet 42j at a position intermediate 42a and the end of the array.

W is the distance from the centrally located lenslet central axial ray (CAR) intersection with the object plane and the CAR of lenslet 42j intersection with the object plane. The terms $t_o$, $t$ and $t_1$ are the object, lens and image distances; m is the magnification value (less than unity in FIG. 3 with $t_1 < t_o$). The term d represents the displacement of the two end surfaces of lenslet 42j. $L_{enl}$ and $L_{RED}$ are the distances of the surface centers of lenslet 42j from lenslet 42a. Z is the total conjugate of the system. $R_1$ is the radius of curvature of the object side spherical portion of the lenslets; $R_2$ is the radius of curvature of the image side spherical portion of the lenslets. For this design $R_2 = -R_1$.

The lenslets shown have several distinctive characteristics. The portions raised above the surface of the body are radially symmetric about a center line normal to the object and image planar. The non-raised portions of the lenslets lie within the same distance t or stated alternately planes A—A and B—B are parallel, and the center axis of lenslet 42a is normal to object and image planes while lenslets away from the center have center axes which depart from this perpendicular orientation.

Figure 4:
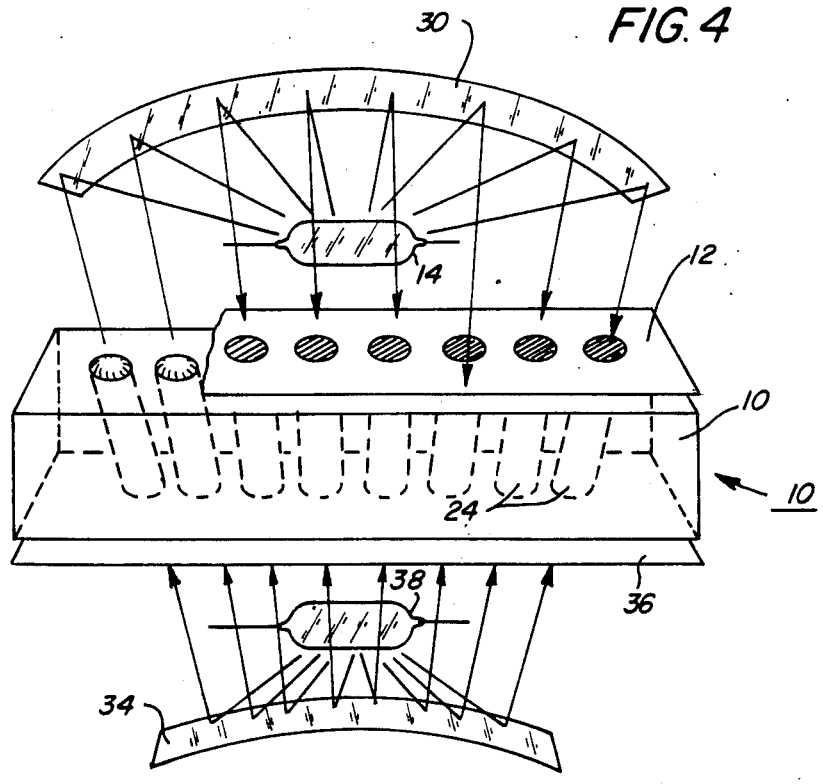
FIG. 4 shows a top perspective view of a homogeneous soft glass body exposed to a convergent pattern (top surface) and divergent pattern (bottom surface) of ultraviolet radiation.

The design equation for the lenslets shown in FIG. 4 are as follows:

$$t_1 = \frac{R_1 R_2 \left(1 - m - \frac{(n-1)t}{R_1 n}\right)}{(n-1)(R_2 - R_1 + t - t/n)} \quad (2)$$

$$t_0 = \frac{R_1 R_2 \left(1 - 1/m + \frac{(n-1)t}{R_2 n}\right)}{(n-1)(R_2 - R_1 + t - t/n)} \quad (3)$$

$$t = \frac{(Z + R_1 - R_2)}{2} - \{(R_2 - R_1 - TC)2/4 - [nZ(R_1 - R_2) - R_1 R_2(Z - m + 1/m)]/(n-1)\} \quad (4)$$

The amount of tilt for each non-central lenslet may be computed as follows. Lenslet 42j tilt angle, $\Theta'$, is found by solving the equation $$d + \frac{nd(t_0 + t_1)}{\sqrt{r^2 + d^2}(1 - n^2)} - W(1 - m) = 0 \quad (5)$$

for d and substituting d into the equation $\Theta' = \arctan(d/t)$ to find the tilt angle. A specific system can then be designed on the following principles.

EXAMPLE

The following data represents the parameters and characteristics for a specific system design. All data except for the thickness and object and image conjugates are given as part of the initial design. Lenslet thickness and conjugates are calculated and the tilt angle between lenslets is calculated using Equation (2).

| | | |
|---|---|---|
| Z = | 25.41 mm | (object-to-image distance) |
| m = | .82 | (magnification) |
| n = | 1.5 | (refractive index) |
| $R_c$ = | .828 mm | (radius of curvature of lenslets) |
| r = | .175 mm | (radius of element) |
| t = | 6 mm | (Thickness) |
| $t_0$ = | 10.5 mm | (object conjugate) |
| $t_1$ = | 8.91 mm | (image conjugate) calculated |
| b = | 1.025 | (spacing parameter at image plane) |

Table 2 lists the lens parameters for 6 lenslets, 3 at a center location and 3 at end locations.

TABLE 2

| J | W | d | $\theta'$ | Lred | Lenl |
|---|---|---|---|---|---|
| 0 | 0 | 0 | 0 | 0 | 0 |
| 1 | .4375 | .0133 | .193 | .389 | .402 |
| 2 | .8750 | .0266 | .386 | .776 | .804 |
| 246 | 107.6250 | 2.8310 | 25.260 | 95.845 | 98.677 |
| 247 | 108.0625 | 2.8400 | 25.330 | 96.238 | 99.074 |
| 248 | 108.5000 | 2.8480 | 25.390 | 96.628 | 99.476 |

The table gives the lenslet surface displacements (d), the lens tilt angle ($\Theta'$), the lenslet surface locations (Lred and Lenl) for several places along the document width.

Figure 5:
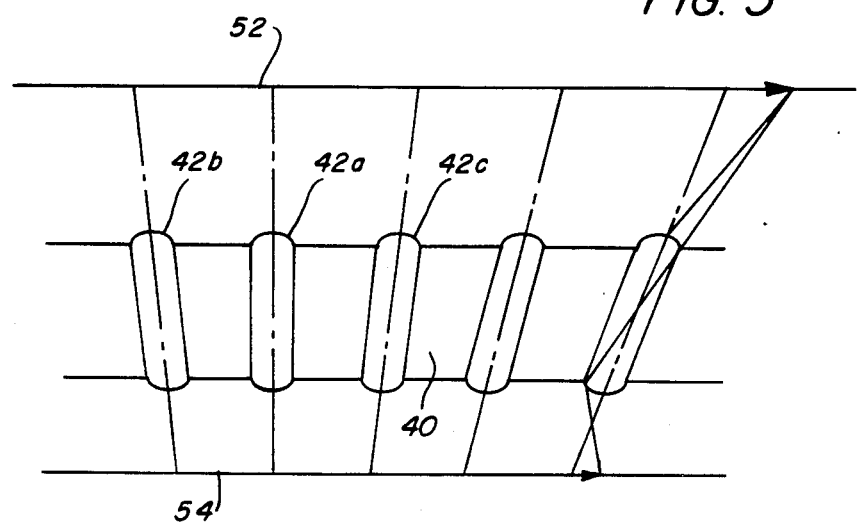
FIG. 5 shows a side view of a reduction/enlargement thick lens array formed by the exposure process shown in FIG. 3.

The above discussion has been directed towards a short focal length lens array with a single row of lenslets. This type of lens array is suitable, for example, as the projection lens in an optical system wherein a document is incrementally scanned. For this type of scanning function, a staggered multiple-row embodiment is preferable to obtain exposure uniformity and radiometric speed at the image plane. Once the design of a particular reduction/enlargement lens has been determined, there are several methods for forming the array. A first method is shown in FIG. 4. FIG. 4 illustrates a modification of the FIG. 1 lens masking method wherein a concave mirror 30 is positioned off-axis and above mask 12. A mercury lamp 14, approximating a point source, is positioned so as to reflect light from mirror 30 towards the surface of glass body 10. The slightly convergent (rather than collimated as in the 1:1 version) reflected light passes through mask 12 and onto the top surface of glass body 10. Because of the convergent light, the center axes of the lenslets 24 which are formed will make various angles (be tilted) with respect to each other. A second convex mirror 34 is positioned off axis and below mask 36. A second mercury lamp 38 is positioned so as to reflect light from convex mirror 34 onto the bottom surface of glass body 10. The slightly divergent light passes through mask 36 and onto the bottom surface of body 10. A rectangular, elongated one row lens array formed by this process is shown in FIG. 5. A lens array 40 has a centrally located lenslet 42a approximately perpendicular to an object plane 52 which can be, for example, a document platen in a copier, and to an image plane 54 which can be, for example, a flat photoreceptor belt. The center axes of the lenslets (42b, 44c) on both sides begin to depart from this perpendicular orientation. Depending upon the curvature of mirrors 30, 34 and the parameters of the mask and glass body, the lenslets produce overlapping contiguous images which are resolved into continuous reduced images (for the array orientation shown) or an enlarged image (if the lenslet faces are reversed) at image plane 54.

Figure 6:
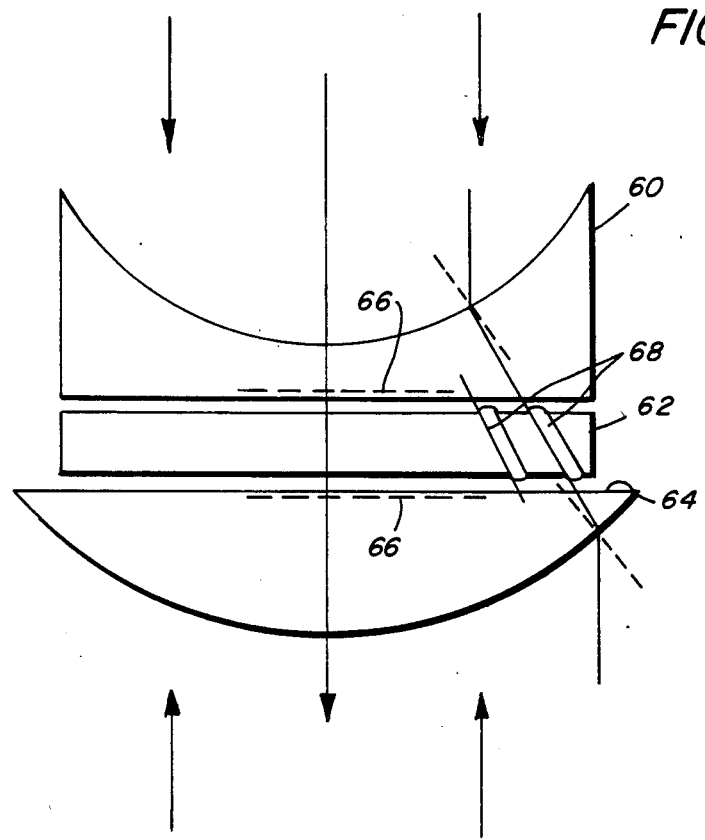
FIG. 6 shows a side view of a reduction/enlargement thick lens array formed by directing an ultraviolet collimated light onto the surface of a plane concave/convex lens placed against the surface of a photosensitive glass member.

Another method of forming the lens reduction/enlargement array is shown in FIG. 6. FIG. 6 illustrates the formation of a plurality of tilted lenslets which, collectively, form a two-dimensional reduction/enlargement thick lens array. The masks 12, 36 of FIGS. 1 and 4 are replaced by masks having the requisite optical power. Mirrors 30, 34 of the FIG. 4 embodiment, are thus not required. As shown, a curved planar concave lens 60 is positioned above a glass body 62. Body 62 has a bottom surface area of, for example, 8½ × 11 inches. A planar convex lens 64 is positioned beneath. The lens surface facing body 62 has approximately the same area as body 62. Opaque dots 66 are spaced on the planar surface of each lens with a spacing distance dependent on the magnification required. Collimated light or light divergent from a small source passes through lens 60, 64 and opaque spots 66, forming tilted spherical lenslets 68 within body 62. The light emerges along the ray path shown. This technique can also be used to produce a row-type lens array by using elongated lens and glass body.

Figure 7:
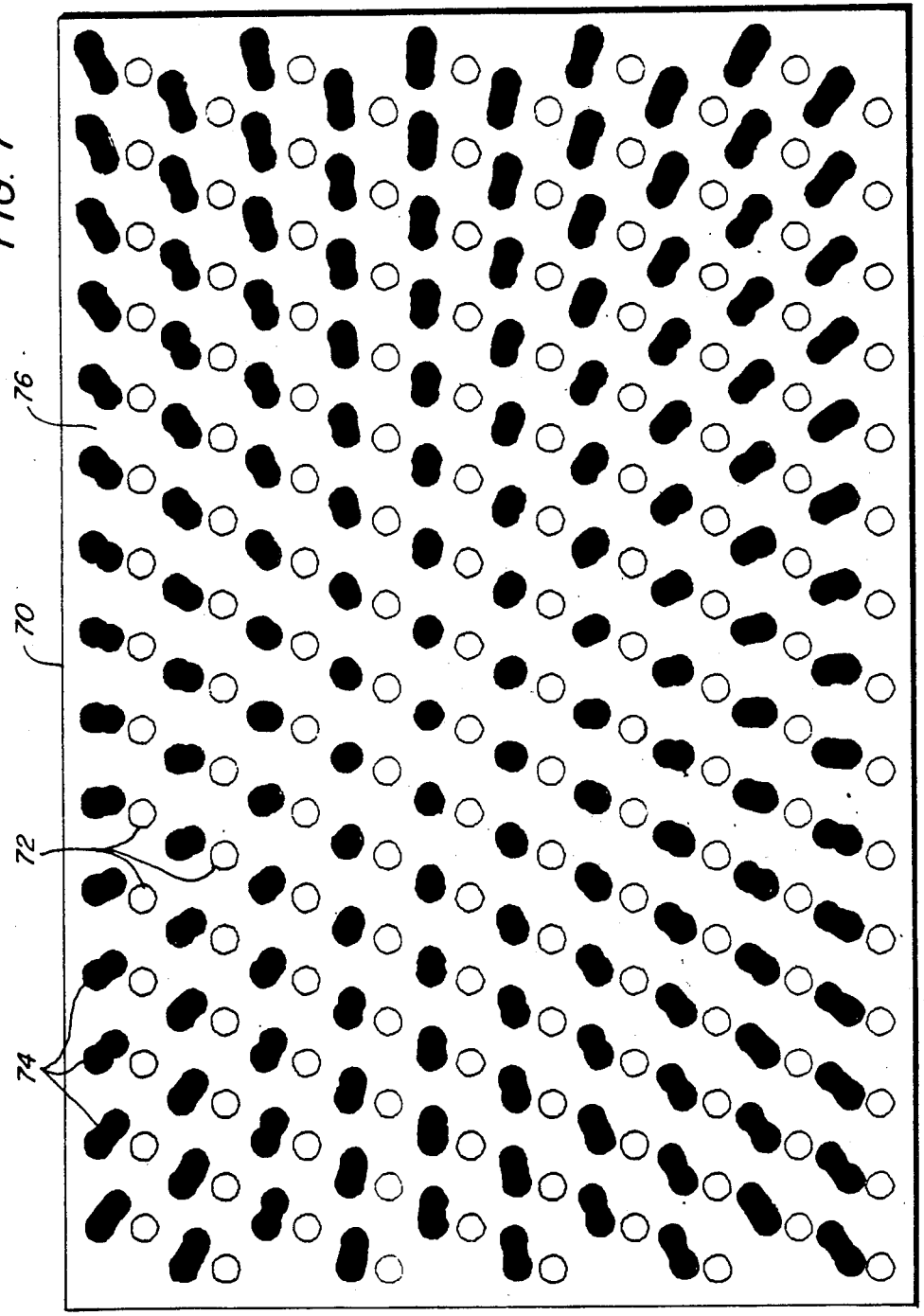
FIG. 7 shows a top view of a planar, two-dimensional lens array having more than one magnification capability.

The full frame array formed as described above has use only at the reduction/enlargement values imparted by the particular lens/machine combination. It would be desirable to use one planar two-dimensional lens which can be used to provide a plurality of magnification/enlargement values. FIG. 7 shows the top view of a full frame short focal length array 70 having a plurality of lenslets 72, shown in white to differentiate from lenslet 74, shown in black. The lenslets are located within a transparent planar body 76. Lenslets 72 are non-tilted with respect to each other and are formed to provide an erect image at unity magnification when properly positioned between an object and image plane. Lenslets 74 are tilted with respect to each other to project an image at a particular reduction/enlargement value. This top view shows the whole lens rod projected onto the top surface of the array. The elongation of lenslets 74 projection is caused by the lenslets' tilt. The lenslets can be formed either by the technique shown in FIG. 6 or by molding techniques where body 76 is molded to provide holes of the required diameter and lenslets 72, 74 are preformed gradient index rods which are inserted into position following the molding step. The body 76 can be plastic, glass or other suitable optical material.

Figure 8:
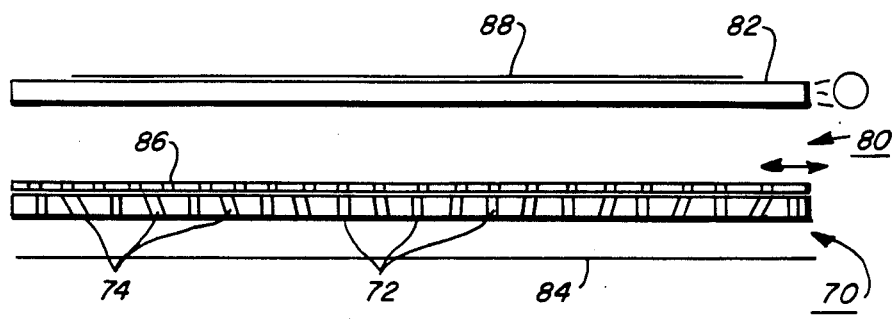
FIG. 8 is a side view of the array of FIG. 7.

FIG. 8 shows a side view of the full frame lens array 70 in an imaging system 80 positioned between a document platen 82 and a photosensitive recording medium 84. A partially opaque mask 86 is positioned between platen 82 and lens array 70. Mask 86 is movable from left to right and is designed to mask out one or the other of the sets of lenslets 72 or 74. A document 88 on platen 82 is illuminated by introducing light into the edge of platen 82 which has been modified by forming a plurality of reflective dots along the surface. The light is projected interior to the platen reflecting upward to illuminate the document when encountering a reflective dot. Further details of an exemplary platen and illumination systems are contained in U.S. Pat. No. 4,568,179 whose contents are hereby incorporated by reference. The light reflected from the document then passes through the transmissive portion of mask 86. If, for example, the opaque portion of mask 86 overlies the lens area 74, a 1:1 image of the document is produced at image plane 84. If lens areas 72 are covered, a reduced image of the document is formed at plane 84.

Other equivalent masking methods may be used: for example, a liquid crystal layer is formed over the top surface of array 70. The array is electronically controlled, as is known in the art, to darken certain areas, while maintaining other areas in a light transmissive mode. Another method is to coat or dope those lenslets associated with sets of magnification values so that each set transmits light only at a selected wavelength. A light source with a variable spectral output can then be used to provide one output associated with the magnification value desired.

While FIGS. 7 and 8 show a two magnification full frame array, it is possible to design more than this number but there is a practical limit on the number of magnifications obtained from one array. Array lenses would usually be arranged in a hexagonally close-packed configuration. This allows for a constant distance between any lenslet and its closest neighbors. If the space between the lenslets of one magnification is sufficiently large, lenslets associated with a different magnification and also hexagonally packed, can fit into the spaces of the first array as shown in FIG. 7. It is desirable to have the lenslets packed as close as possible to maximize radiometric speed and exposure uniformity. The lenslets working in reduction will be tilted toward the center of the array. These tilted lenslets will take up more space in the array than the 1X, straight through lenslets. The degree of tilt determines how much space is necessary for a lenslet. If it is desired to copy larger documents at magnifications further from 1X, the tilt increases. The spacing parameter, b, is a measure of how closely packed like elements are and is given by the formula below:

$$b = S/2R \tag{6}$$

where R is the element radius and S is the distance between Chief Axial Ray (CAR) intercepts in the image plane. For 1X elements, S is also the element center-to-center distance.

Figure 9:
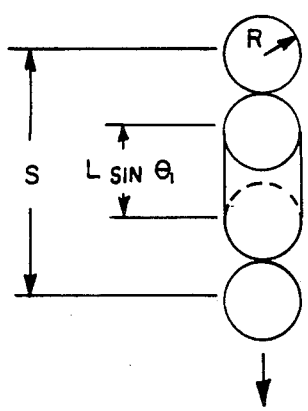
FIGS. 9 and 10 illustrate the inter-fiber packing density relationship for the lenslets of the FIG. 7 embodiment.
Figure 10:
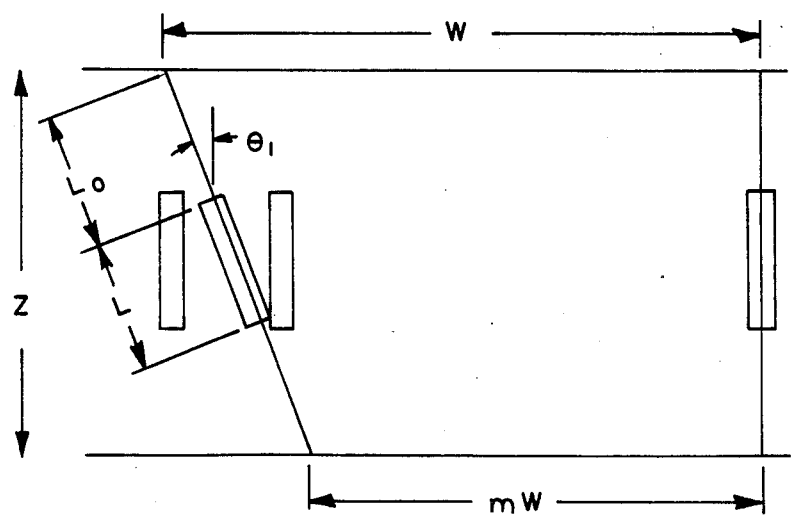

Experiments have shown that a minimum spacing parameter can be estimated knowing the tilt and length of the reduction lenslet on the perimeter of the array. For all conventional document sizes, the lenslets at the extreme width and centered in the length of the array can be used to calculate the minimum b. FIGS. 9 and 10 show how a reduction lenslet fits between two 1X lenslets in this portion of the array for maximum packing efficiency. It was found experimentally that the spacing between the 1X lenslets should be approximately 3% less than the spacing between reduction lenslets on the object side of the array to achieve this packing. For this reason, the formula below may give a value for minimum $b_{1X}$ which is several percent ($\approx 3$) higher than can actually be achieved.

$$b_{1X} = 2LW(1-M)(2RZ)^{-1}[W^2Z^{-2}(1-M)^2+1]^{-\frac{1}{2}} \quad (7)$$

$$b_{1X} = 2 \text{ or } L \sin \Theta/2R \quad (8)$$

$$b_R = mb_{1X} + m_{t_o}(2R)^{-1}\sin\Theta_2 \quad (9)$$

Where
L = Reduction lenslet length at width of reduction array
m = Magnification of the reduction lenslets
R = Lenslet radius
Z = object to image distance
W = Half width of the document
$\Theta_1$ = Reduction lenslet tilt at width of reduction array
$\Theta_2$ = Tilt of reduction element nearest to central reduction lenslet
$t_o$ = Object conjugate distance of reduction lenslet nearest to central reduction lenslet.

A sample design using SELFOC gradient index rods of large radius is given below.
L = 26.37 mm
m = 0.82
R = 1 mm
Z = 125 mm
W = 128 mm
$\Theta_1$ = 0.183316 rad
$\Theta_2$ = 0.003498 rad
$1_o$ = 55.415 mm
$b_{1X}$ = (from Eq. 4 or 5) = 4.39
$b_R$ (from Eq. 6) = 3.68

A value of b this large might result in excessive irradiance non-uniformities. The spacing parameter or the irradiance non-uniformities can be reduced by:

1. using dimensions of the above design and with an R = 2.4 mm, the minimum $b_{1X}$ was found to be approximately 3.
2. using neutral density masks to smooth out the non-uniformities, or
3. by using lenslets which have a large object and image height, or
4. by using packing configurations other than hexagonally, close packed.

Although the present invention has been described with particularity relative to the foregoing detailed description of the exemplary preferred embodiments, various modifications, changes, additions and applications of the present invention, in addition to those mentioned herein will be readily apparent to those having normal skill in the art without departing from the spirit of this invention. For example, although the planar lens assemblies are shown as thick lenses formed by the aforementioned masking and heating process, the assembly could also be formed as a plurality of gradient index lenslets placed into apertures formed in a plastic body, or the like during a molding process. All such changes, modifications and embodiments are intended to be within the scope of the following claims:

What is claimed is:

1. A short focal length lens array comprising a homogenous photosensitive glass body having formed therethrough a plurality of lenslets, at least one face of each lenslet having a spherical surface extending above the glass body surface, the lens array characterized by the center axes of said lenslets being tilted with respect to each other from the center of the array out to the array edges and by the array having a two-dimensional, full frame configuration.

2. The lens array of claim 1 wherein at least two sets of lenslets, each set identified with a specific magnification, are formed within the glass body.

3. In an imaging system for transmitting an image of an object lying in an object plane onto a photosensitive image plane at a magnification other than unity; a lens array comprising a homogenous glass body having formed therethrough a plurality of lenslets, at least one face of each lenslet having a spherical surface extending above the glass body surface, the lens array characterized by the optical axes of said lenslets being tilted with respect to each other from the center of the array out to the array edges and by said spherical surfaces being radially symmetric about a center line normal to the object and image planes.

4. The imaging system of claim 3 wherein said lens array comprises at least a single row of lenslets.

5. The imaging system of claim 3 wherein said lens array comprises a multiple staggered row of lenslets.

6. The imaging system of claim 3 wherein said lens array has a two-dimensional, full frame configuration.

7. An imaging system for a multi-magnification document reproduction device wherein a document in an object plane is exposed at a photosensitive image plane at one of a number of selected magnifications, said imaging system including a short focal length lens array comprising a two-dimensional homogenous photosensitive glass body having formed therethrough at least two sets of lenslets, having spherical surfaces extending above the glass body, at least one lenslet set having its center axis tilted with respect to each other from the center of the array out to the array edges, said imaging system further including illumination means to uniformly illuminate the document, and masking means placed between the object plane and the lens array, said masking means adapted to transmit light through a selected set of lenslets whereby the document image is projected onto the imaging plane at the magnification of the selected set.

8. A short focal length lens array comprising a homogenous two-dimensional planar body having a plurality of generally cylindrical apertures therethrough, said apertures seating a plurality of gradient index fibers, the center axes of said apertures, and hence of the seated rods, being tilted with respect to each other from the center of the array out to the array edges.

9. A short focal length lens array comprising a homogenous support member having formed therethrough a plurality of lenslets, each lenslet having a cylindrical central portion bounded by spherical faces raised above the support member surface, said central portion having center axes which are substantially perpendicular at the center and which tilt away form each other from the center outward said spherical faces being radially symmetric about a center line normal to the object and image planes.

10. The lens array of claim 9 wherein planes through the interface between said central portions and said spherical surfaces are parallel.

* * * * *